US012564067B2

(12) United States Patent
Uchiyama et al.

(10) Patent No.: US 12,564,067 B2
(45) Date of Patent: Feb. 24, 2026

(54) WAFER ALIGNMENT FOR STACKED WAFERS AND SEMICONDUCTOR DEVICE ASSEMBLIES

(71) Applicant: Micron Technology, Inc., Boise, ID (US)

(72) Inventors: Shiro Uchiyama, Tokyo (JP); Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 822 days.

(21) Appl. No.: 17/589,472

(22) Filed: Jan. 31, 2022

(65) Prior Publication Data

US 2023/0065325 A1 Mar. 2, 2023

Related U.S. Application Data

(60) Provisional application No. 63/239,854, filed on Sep. 1, 2021.

(51) Int. Cl.
H01L 23/544 (2006.01)
(52) U.S. Cl.
CPC .. H01L 23/544 (2013.01); *H01L 2223/54426* (2013.01)
(58) Field of Classification Search
CPC .................... H01L 23/544; H01L 2223/54426
See application file for complete search history.

(56) References Cited

U.S. PATENT DOCUMENTS

2020/0350257 A1 11/2020 Yang et al.
2021/0242135 A1* 8/2021 Chen .................... H01L 21/6835

FOREIGN PATENT DOCUMENTS

CN 111415955 A 7/2020
CN 112514063 A 3/2021

OTHER PUBLICATIONS

Office Action received in CN App No. 202211030115.6 dated Sep. 25, 2025, pp. all.

* cited by examiner

*Primary Examiner* — Britt D Hanley
*Assistant Examiner* — Victor V Barzykin
(74) *Attorney, Agent, or Firm* — Dorsey & Whitney LLP

(57) ABSTRACT

A semiconductor device assembly including a first semiconductor wafer having a first side and a second side opposite the first side, the first semiconductor wafer including: a first plurality of semiconductor devices at the first side, a plurality of non-metallic vias extending from the second side towards the first side, and a plurality of alignment marks, each vertically aligned with a corresponding one or more of the plurality of non-metallic vias, a second semiconductor wafer including a second plurality of semiconductor devices and a plurality of registration marks, each of the plurality of registration marks vertically aligned with a corresponding one or more of the plurality of alignment marks.

23 Claims, 11 Drawing Sheets

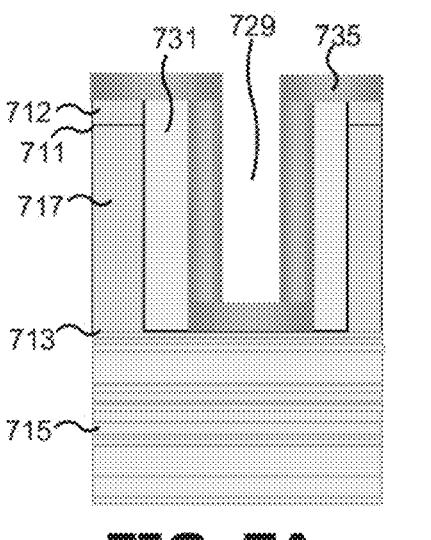
FIG. 7A
FIG. 7B
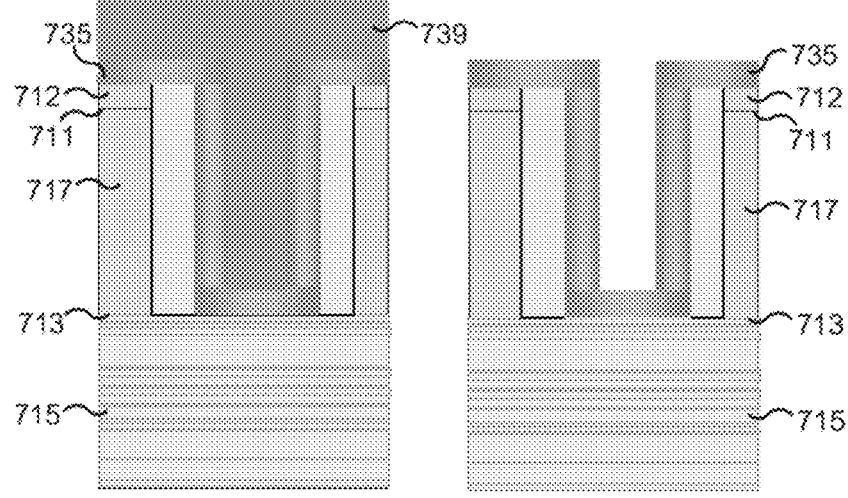
FIG. 7C
FIG. 7D
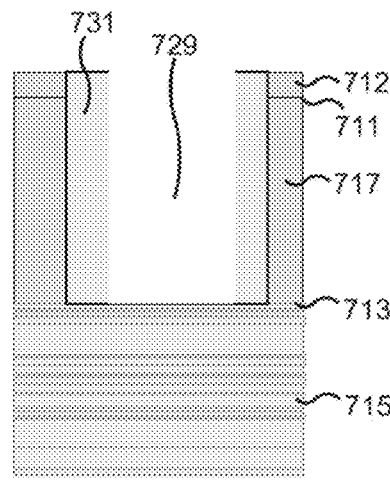
FIG. 7E

WAFER ALIGNMENT FOR STACKED WAFERS AND SEMICONDUCTOR DEVICE ASSEMBLIES

CROSS-REFERENCE TO RELATED APPLICATION(S)

The present application claims priority to U.S. Provisional Patent Application No. 63/239,854, filed Sep. 1, 2021, the disclosure of which is incorporated herein by reference in its entirety.

TECHNICAL FIELD

The present disclosure relates to wafer alignment, and more particularly relates to wafer alignment for stacked wafers and semiconductor device assemblies.

BACKGROUND

Conventional semiconductor wafer alignment for stacking semiconductor wafers generally requires viewing through semiconductor films on the semiconductor wafers or viewing between semiconductor wafers at an angle to properly adjust the wafers before the wafer stacking process. In this manner, the stacked wafers cannot use registration marks as the wafers are aligned prior to stacking and bonding which prevents the use of feedback/feedforward wafer processing methodologies. The trend to manufacture ever smaller electronic devices has led to significant increases in semiconductor device densities and stacking of many semiconductor films and materials making use of conventional wafer stacking process impractical or unviable. Moreover, to cut costs, larger wafers are used to yield more semiconductor devices resulting in a significant reduction in alignment margin required for using the conventional wafer stacking process. Thus, the conventional wafer alignment process cannot obtain alignment accuracy required for feedback/feedforward wafer processing methodologies.

BRIEF DESCRIPTION OF THE DRAWINGS

FIGS. 6A-6E are simplified schematic cross-sectional views of processing an exemplary non-metallic via without using metal fill in accordance with an exemplary embodiment of the present disclosure.

FIGS. 7A-7E are simplified schematic cross-sectional views of processing an exemplary non-metallic via using metal fill in accordance with an exemplary embodiment of the present disclosure.

Figures 1A, 1B, 1C:
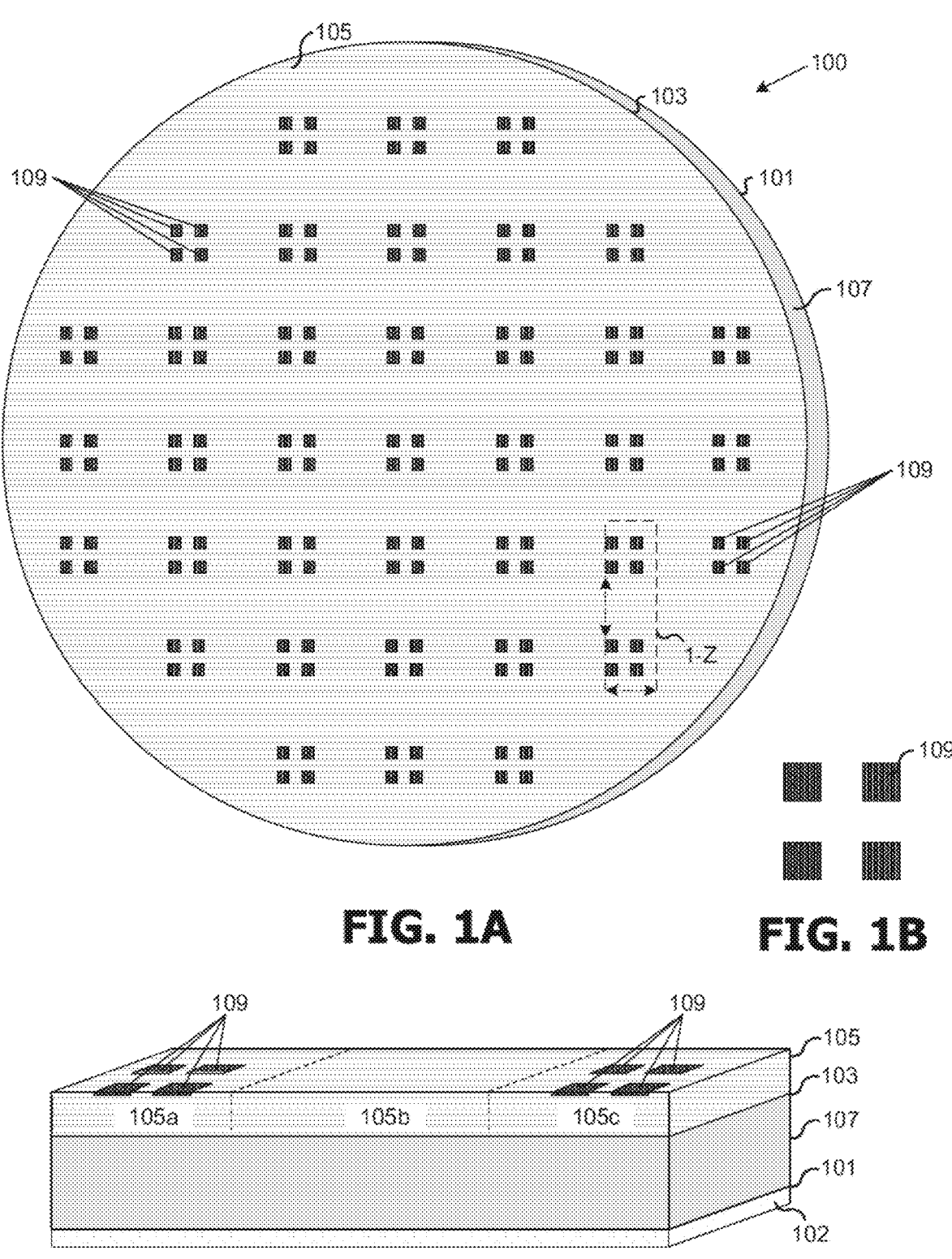
FIG. 1A is a plan view of exemplary registration marks on a first semiconductor wafer in accordance with an exemplary embodiment of the present disclosure.
FIG. 1B is a magnified view of the exemplary registration mark of FIG. 1A.
FIG. 1C is a simplified schematic cross-sectional view of FIG. 1A taken from the cut-out of 1-Z.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As set forth above, conventional wafer alignment processes cannot obtain alignment accuracy required for feedback/feedforward wafer processing methodologies. Embodiments of the present disclosure solve this challenge, and others, by providing non-metallic vias for use in wafer alignment processes. The use of non-metallic vias allow features or marks formed on a second stacking wafer positioned below stacking wafer to be viewed through the vias (e.g., in a wide range of wavelengths, including visible, infrared, ultraviolet, and others). The non-metallic vias of stacking wafer provide visual feedback for in situ alignment of a first stacking wafer with a second stacking wafer throughout the stacking process, allowing an operator to adjust either stacking wafer during a stacking and bonding process based on features or marks visible through the non-metallic vias. In this manner, a stacked wafer may include registration marks to allow wafers to be aligned prior to stacking and bonding to allow use of feedback/feedforward wafer processing methodologies.

As can be seen with reference to FIGS. 1A-1C, an exemplary first stacking wafer 100 for forming a semiconductor device assembly of the present disclosure may include semiconductor wafer 107 with an active surface on the first side 103 having semiconductor film stack 105 and second side 101 over which is disposed passivation layer 102. The semiconductor wafer 107 may include a plurality of registration marks, such as registration mark 109, to facilitate wafer-level alignment processes.

An exemplary registration mark 109 is shown in detail in FIG. 1B. Registration mark 109 may include an array of visible marks arranged in a predetermined pattern, such as a group of four squares arranged around a common center. Various other registration marks may be used including lines, objects, polygons, and other geometric and non-geometric shapes to obtain registration mark 109 for the first stacking wafer 100 to align with corresponding alignment mark of second stacking wafer.

As can be seen with reference to FIG. 1C, an exemplary cross-sectional view of the first stacking wafer 100 taken along the cut-out of 1-Z is shown. As shown, an active surface on the first side 103 includes semiconductor film stack 105 having regions 105a, 105b, and 105c where one or more regions 105a-105c may include one or more semiconductor devices, and on the second side 101 passivation layer 102 is formed. For example, a plurality of semiconductor devices may be formed on region 105c only, or a plurality of semiconductor devices may be formed on combination of regions 105a and 105b, regions 105a and 105c, and so forth. A plurality of registration marks 109 may be formed on the semiconductor film stack 105 in, for example and not limited to, regions 105a and 105c of which one or both could include semiconductor devices.

Figures 2A, 2B, 2C:
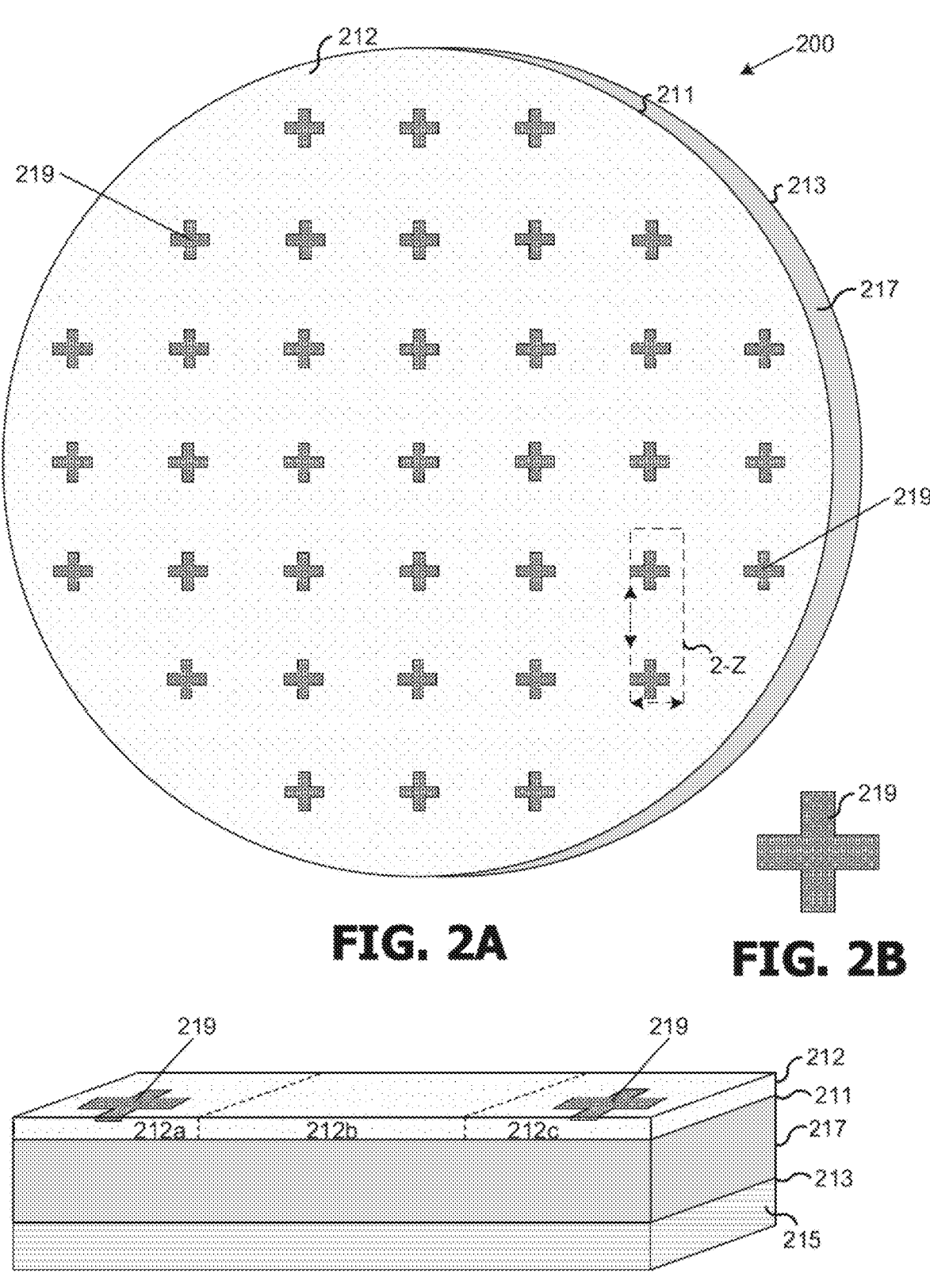
FIG. 2A is a plan view of exemplary alignment marks on a second semiconductor wafer in accordance with an exemplary embodiment of the present disclosure.
FIG. 2B is a magnified view of the exemplary alignment mark of FIG. 2A.
FIG. 2C is a simplified schematic cross-sectional view of FIG. 2A taken from the cut-out of 2-Z.

As can be seen with reference to FIGS. 2A-2C, an exemplary second stacking wafer 200 with alignment marks 219 is provided for the process of forming non-metallic vias in accordance with an exemplary embodiment of the present disclosure. An array of non-metallic vias may be formed in the exemplary second stacking wafer 200 (e.g., as shown in FIGS. 3A-3C and FIGS. 5A-5E) to allow visual feedback for in situ alignment of a first stacking wafer 100 with second stacking wafer 200 throughout the stacking process. The exemplary second stacking wafer 200 may include semiconductor wafer 217 with an active surface on the first side 213 having semiconductor film stack 215, and passivation layer 212 on the second side 211. The semiconductor wafer 217 may include a plurality of alignment marks, such as alignment mark 219, to facilitate wafer-level alignment processes.

An exemplary alignment mark 219 is shown in detail in FIG. 2B. Alignment mark 219 may include an array of visible marks arranged in a predetermined pattern, such as a cross or "+" sign. Various other alignment marks may be used including lines, objects, polygons, and other geometric and non-geometric shapes to create corresponding alignment mark 219 on the second stacking wafer 200 for the registration marks 109 of the first stacking wafer 100.

As can be seen with reference to FIG. 2C, an exemplary cross-sectional view of the second stacking wafer 200 taken along the cut-out of 2-Z is shown. As shown for the semiconductor wafer 217 includes an active surface on the first side 213 having semiconductor film stack 215 and on the second side 211 passivation layer 212 is formed. The passivation layer 212 has regions 212a, 212b, and 212c where one or more regions 212a-212c may overlay one or more semiconductor devices formed in the semiconductor film stack 215. A plurality of alignment marks 219 may be formed on the passivation layer 212 in, for example and not limited to, regions 212a and 212c of which one or both regions could overlay semiconductor devices formed below in the semiconductor film stack 215. For example, a plurality of semiconductor devices may be formed below region 212c only, or a plurality of semiconductor devices may be formed below combination of regions 212a and 212b, regions 212a and 212c, and so forth.

As can be seen with reference to FIGS. 3A-3D, an exemplary stacking wafer 300 for forming a semiconductor device assembly of the present disclosure may include a plurality of alignment marks 319 and one or more non-metallic vias 329 formed on a semiconductor wafer 317 and near, adjacent to, or intersecting one or more edges or borders of each alignment mark 319 or formed along or intersecting a closed boundary or perimeter of each alignment mark 319. The semiconductor wafer 317 includes an active surface on the first side 313 having semiconductor film stack 315 and on the second side 311 passivation layer 312 is formed.

Figures 3A, 3B, 3C:
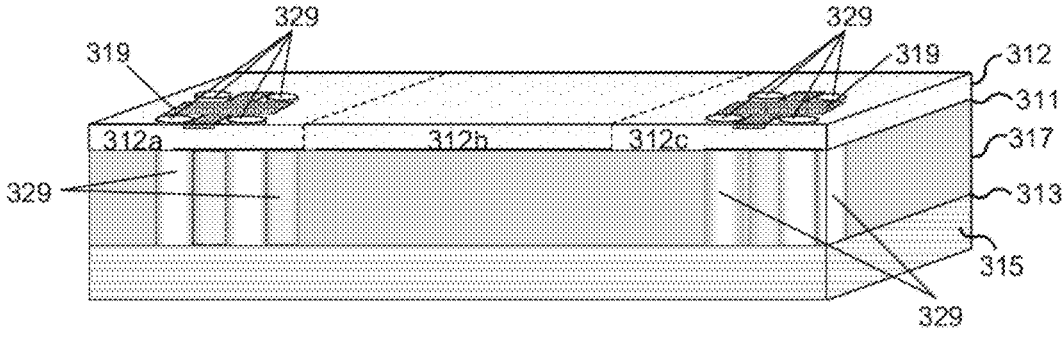
FIG. 3A is a plan view of non-metallic vias along a perimeter of the alignment marks of FIG. 2A.
FIG. 3B is a magnified view of the semiconductor device film stack as viewed through the non-metallic vias formed along the perimeter of an alignment mark of FIG. 3A.
FIG. 3C is a simplified schematic cross-sectional view of FIG. 3A taken from the cut-out of 3-Z.

As can be seen with reference to FIG. 3B, an exemplary alignment mark 319 and non-metallic vias 329 are shown. The non-metallic vias 329 are formed between adjacent edges of the alignment mark 319. Various other alignment marks may be used including lines, objects, polygons, and other geometric and non-geometric shapes so long as a complementary or corresponding registration mark may be reasonably formed on another stacking wafer and used to align with stacking wafer 300. Moreover, as shown in FIGS. 3B-3D, non-metallic vias 329 may extend completely through passivation layer 312 and semiconductor wafer 317 to reveal semiconductor film stack 315.

Figures 3D, 4A:
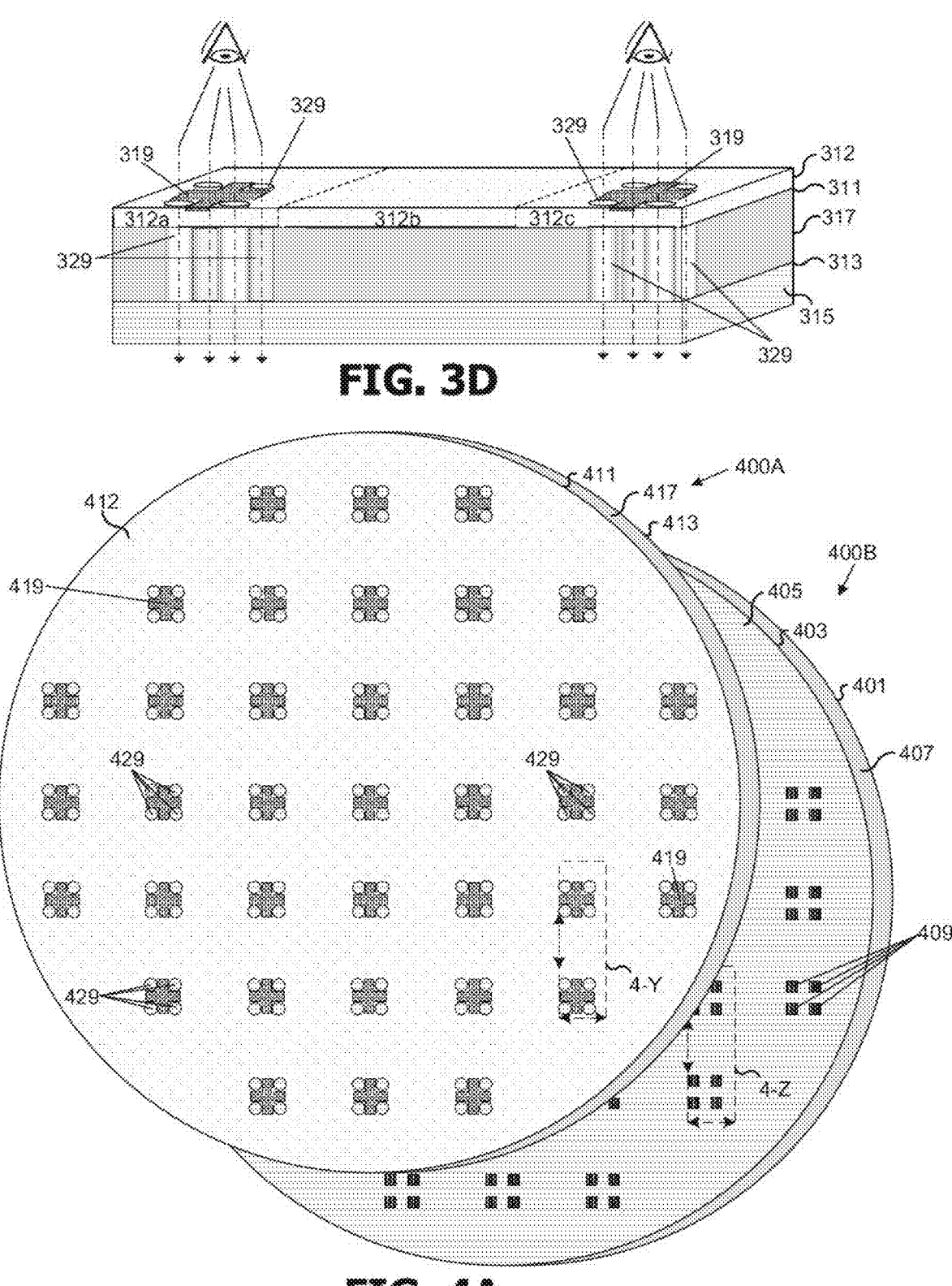
FIG. 3D is another simplified schematic cross-sectional view of FIG. 3A taken from the cut-out of 3-Z.
FIG. 4A is a perspective view of the second semiconductor wafer of FIG. 3A vertically aligned with the first semiconductor wafer of FIG. 1A in accordance with an exemplary embodiment of the present disclosure.

As can be seen with reference to FIGS. 3C-3D, non-metallic vias 329 are formed on passivation layer 312, the passivation layer 312 having regions 312a, 312b, and 312c where none, one or a plurality of regions 312a-312c may overlay a semiconductor device formed in the semiconductor film stack 315. The non-metallic vias 329 extend through passivation layer 312 and first side 313 and second side 311 of semiconductor wafer 317.

The non-metallic vias 329 allow features or marks formed on a second stacking wafer positioned below stacking wafer 300 to be visible. The non-metallic vias 329 of stacking wafer 300 provide visual feedback for in situ alignment of stacking wafer 300 with a second stacking wafer throughout the stacking process, allowing an operator to adjust either stacking wafer during a stacking and bonding process based on features or marks visible through the non-metallic vias 329. The features or marks formed on the second stacking wafer are visible or seen through the plurality of non-metallic vias 329 in a spectrum of wavelengths in the range of 400-700 nm, a spectrum of wavelengths in the range of 700-2000 nm, or spectrum of wavelengths in the range of 2-50 um. In this manner, a stacked wafer may include registration marks to allow wafers to be aligned prior to stacking and bonding to allow use of feedback/feedforward wafer processing methodologies.

As can be seen with reference to FIGS. 4A-4E, two exemplary stacking wafers for forming a semiconductor device assembly of the present disclosure are shown. The first stacking wafer 400A may include a plurality of alignment marks 419 and one or more non-metallic vias 429 formed on a semiconductor wafer 417 and near, adjacent to, or intersecting one or more edges or borders of each alignment mark 419 or formed along or intersecting a closed boundary or perimeter of each alignment mark 419. The semiconductor wafer 417 includes an active surface on the first side 413 having semiconductor film stack 415 and on the second side 411 passivation layer 412 is formed. The second stacking wafer 400B may include a plurality of registration marks 409 formed on a semiconductor wafer 407 where each of the plurality of registration marks 409 vertically align with and correspond to the plurality of alignment marks 419 of the first stacking wafer 400A. The second stacking wafer 400B further includes a semiconductor film stack 405 formed on a first side 403 of the semiconductor wafer 407. The registration marks 409 may also be formed on the first side 403 of the semiconductor wafer 407. Registration mark 409 may include an array of visible marks arranged in a predetermined pattern, such as a group of four squares arranged around a common center. Various other registration marks may be used including lines, objects, polygons, and other geometric and non-geometric shapes to obtain registration mark 409 for the first stacking wafer 400A to align with corresponding alignment mark 419 of second stacking wafer 400B.

Figure 4B:
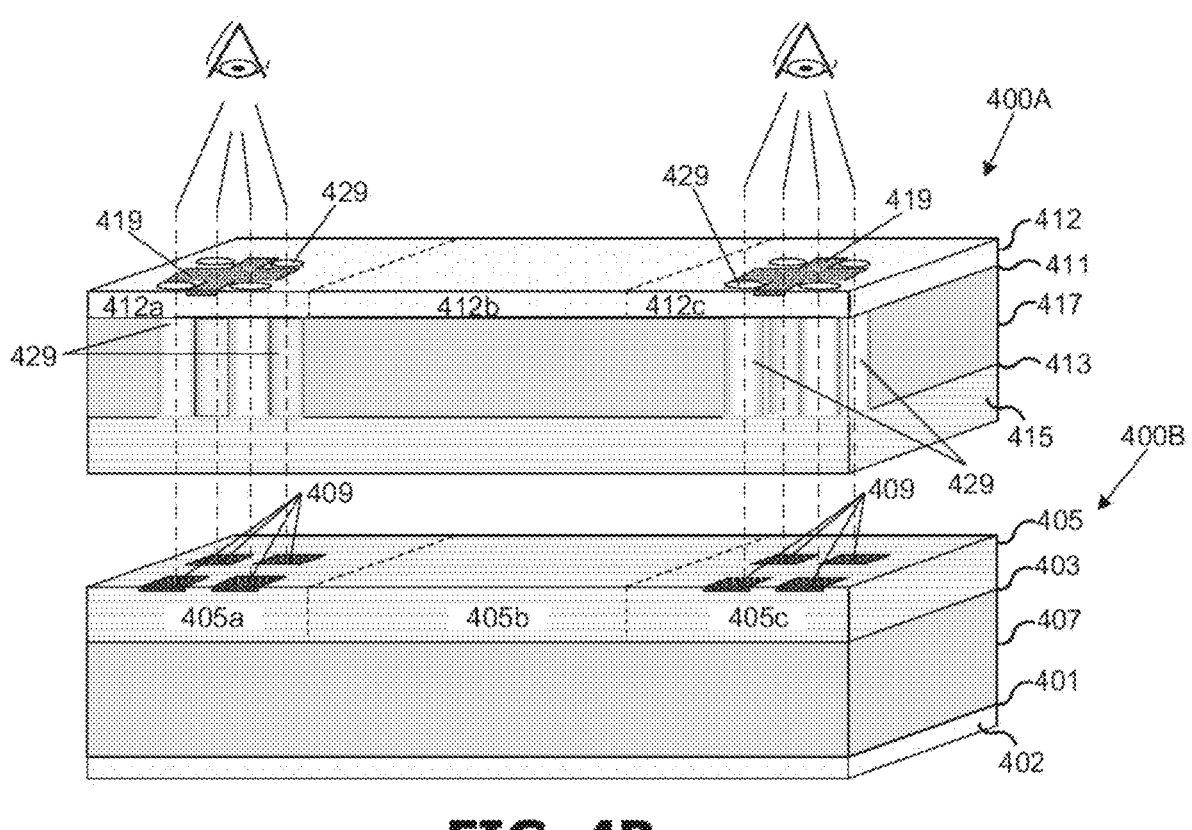
FIG. 4B is a simplified schematic cross-sectional view of FIG. 4A taken from the cut-out of 4-Y over the cut-out of 4-Z.

As can be seen with reference to FIG. 4B, the first stacking wafer 400A and the second stacking wafer 400B are stacked and bonded together in a face-to-face arrangement (e.g., with active surfaces facing each other). The first stacking wafer 400A includes semiconductor wafer 417 having an active surface on the first side 413 with semiconductor film stack 415 and on the second side 411 passivation layer 412 is formed. The passivation layer 412 may include regions 412a, 412b, and 412c where none, one or a plurality of regions 412a-412c may overlay a semiconductor device formed in the semiconductor film stack 415. One or more non-metallic vias 429 are formed on one or more regions 412a-412c that may overlay one or more semiconductor devices formed in the semiconductor film stack 415. The non-metallic vias 429 extend through passivation layer 412 and first side 413 to second side 411 of semiconductor wafer 417 to expose a surface of the semiconductor film stack 415. The one or more non-metallic vias 429 may be formed on the semiconductor wafer 417 and near, adjacent to, or intersecting one or more edges or borders of each alignment mark 419 or formed along or intersecting a closed boundary or perimeter of each alignment mark 419.

As shown in FIG. 4B, non-metallic vias 429 allow portions underneath semiconductor film stack 415 to be visible using, for example, the naked eye and/or a magnified optical instrument (e.g., camera). The alignment marks 419 are made visible through the non-metallic vias 429 in, for example, a spectrum of wavelengths in the range of 400-700 nm, a spectrum of wavelengths in the range of 700-2000 nm, or spectrum of wavelengths in the range of 2-50 um. Further, non-metallic vias 429 allow features or marks formed on a second stacking wafer 400B positioned below first stacking wafer 400A to be visible. The non-metallic vias 429 of first stacking wafer 400A provide visual feedback for in situ alignment of second stacking wafer 400B throughout the stacking process, allowing an operator to adjust either first or second stacking wafer 400A, 400B during a stacking and bonding process based on features or marks visible through the non-metallic vias 429. In this manner, a stacked wafer may include registration marks to allow wafers to be aligned prior to stacking and bonding to allow use of feedback/feedforward wafer processing methodologies.

The second stacking wafer 400B includes semiconductor wafer 407 having an active surface on the first side 403 with semiconductor film stack 405 and on the second side 401 passivation layer 402 is formed. The semiconductor film stack 405 has regions 405a, 405b, and 405c where none, one or a plurality of regions 405a-405c may overlay a semiconductor device formed in the semiconductor film stack 405.

Figure 4C:
FIG. 4C is a magnified view of non-metallic vias along the perimeter of an alignment mark of FIG. 4B.
Figure 4D:
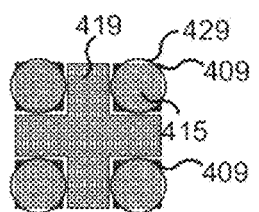
FIG. 4D is a magnified view of the registration mark as viewed through the non-metallic vias of FIG. 4C.
Figure 4E:
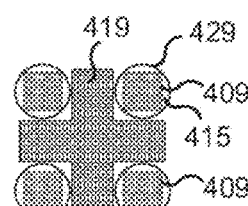
FIG. 4E is another magnified view of the registration mark as viewed through the non-metallic vias of FIG. 4D.

As can be seen with reference to FIGS. 4C-4E, an exemplary alignment mark 419 and non-metallic vias 429 are shown. The non-metallic vias 429 are formed between adjacent edges of the alignment mark 419. Various other alignment marks may be used including lines, objects, polygons, and other geometric and non-geometric shapes so long as a complementary or corresponding registration marks 409 may be reasonably formed on second stacking wafer 400B and used to align with alignment marks 419 of first stacking wafer 400A. As shown in FIG. 4D-4E, non-metallic vias 429 may extend completely through passivation layer 412 and semiconductor wafer 417 to reveal semiconductor film stack 415. Moreover, as shown in FIG. 4E, registration marks 409 are visible through non-metallic vias 429 and the semiconductor film stack 415 and may be used to align first stacking wafer 400A with second stacking wafer 400B. In FIG. 4E, registration marks 409 may be of a different shape or size such that the area of the registration mark 409 only needs to be inscribed by the area of the non-metallic via 429 for the operator to confirm first stacking wafer 400A is aligned with second stacking wafer 400B.

As shown in FIGS. 4B-4E, non-metallic vias 429 allows portions underneath semiconductor film stack 415 to be visible using, for example, the naked eye. The registration mark 409 is made visible through the non-metallic vias 429 in, for example, a spectrum of wavelengths in the range of 400-700 nm, a spectrum of wavelengths in the range of 700-2000 nm, or spectrum of wavelengths in the range of 2-50 um, as well as a wide range of other wavelengths, including ultraviolet and others.

As can be seen with reference to FIGS. 5A-5E, an exemplary stacking wafer 500 for forming a semiconductor device assembly of the present disclosure may include a plurality of alignment marks 519 and one or more non-metallic vias 529 formed on a semiconductor wafer 517 and near, adjacent to, or intersecting one or more edges or borders of each alignment mark 519 or formed along or intersecting a closed boundary or perimeter of each alignment mark 519. The semiconductor wafer 517 includes an active surface on the first side 513 with semiconductor film stack 515 and on the second side 511 passivation layer 512 is formed.

Figure 5A:
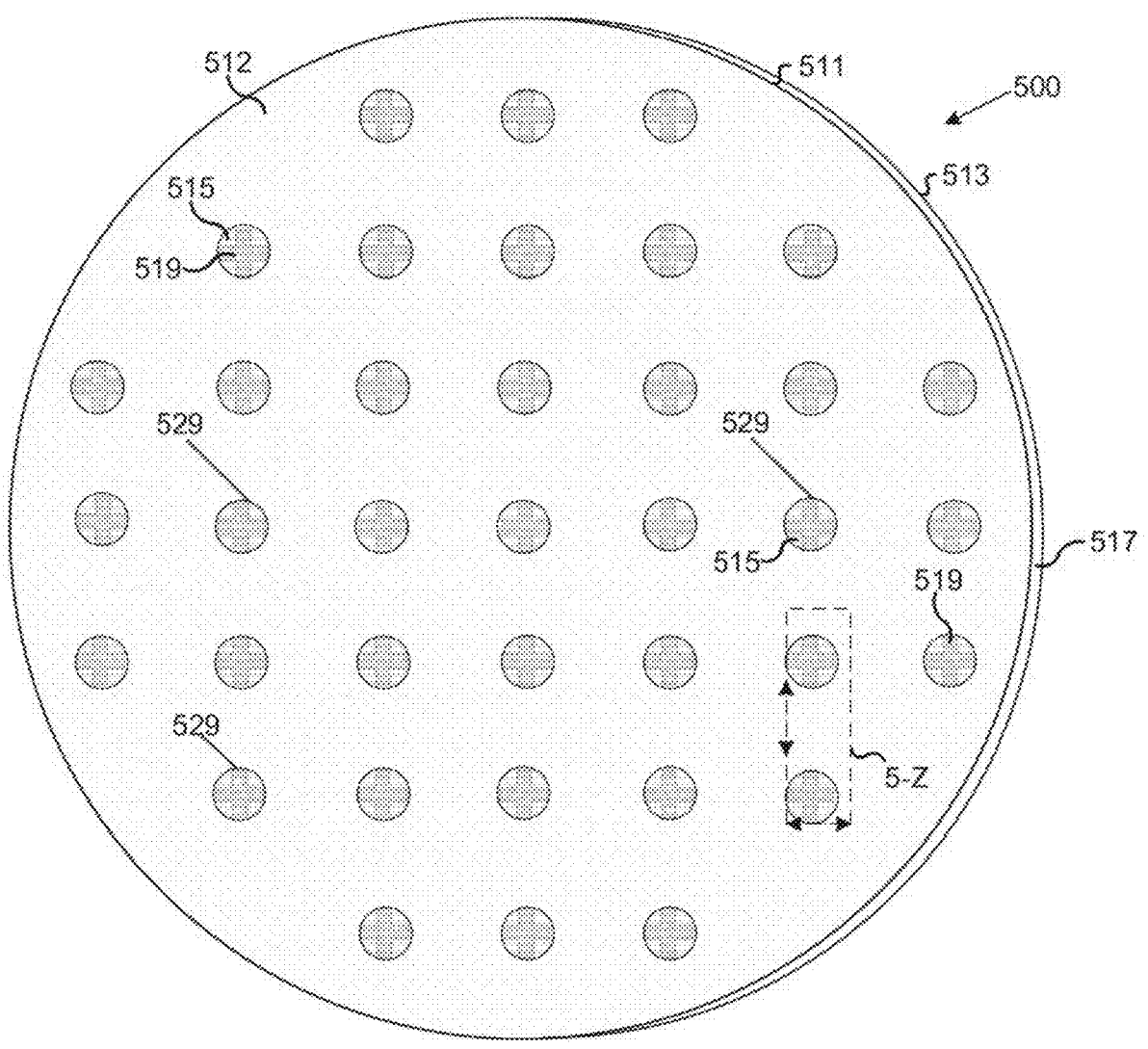
FIG. 5A is a plan view of exemplary alignment marks and non-metallic vias on a second semiconductor wafer in accordance with an exemplary embodiment of the present disclosure.
Figure 5B:
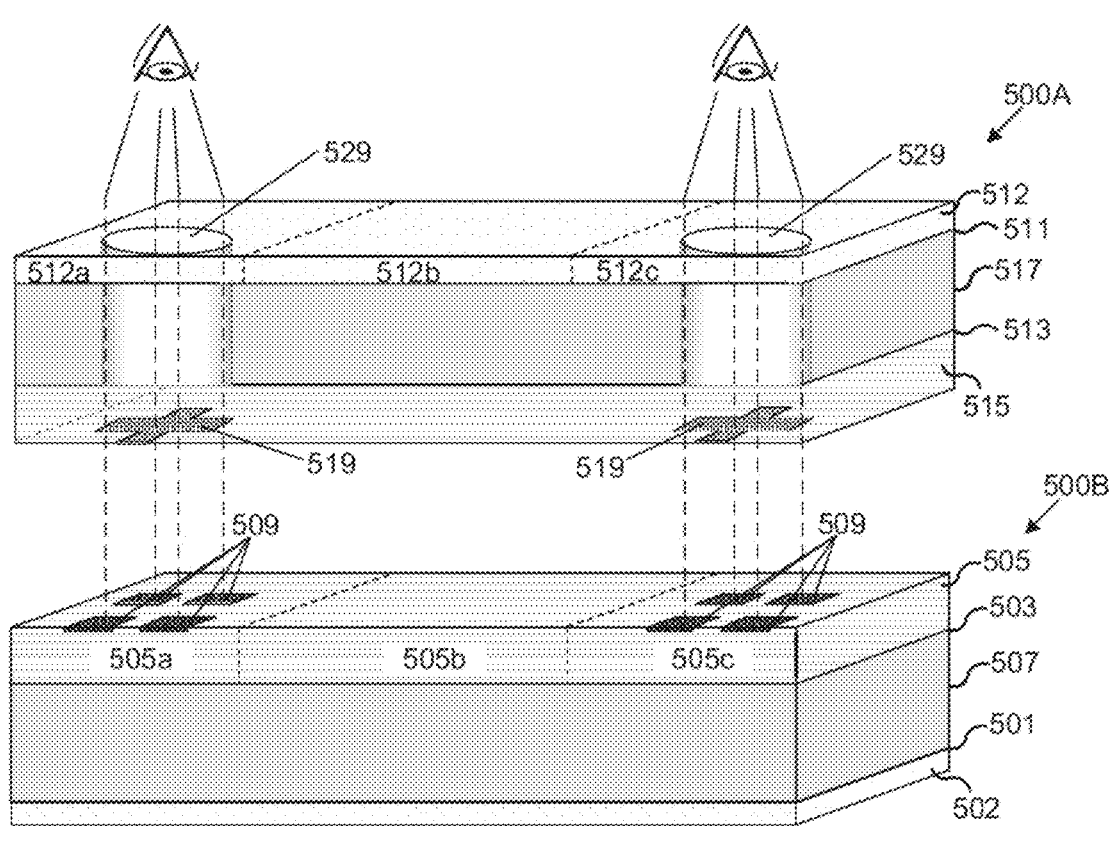
FIG. 5B is a simplified schematic cross-sectional view of FIG. 5A vertically aligned with the first semiconductor wafer of FIG. 1A and taken from the cut-out of 5-Z.

As can be seen with reference to FIG. 5B, the first stacking wafer 500A and the second stacking wafer 500B are stacked and bonded together in a face-to-face arrangement (e.g., with active surfaces facing each other). The first stacking wafer 500A includes semiconductor wafer 517 having an active surface on the first side 513 with semiconductor film stack 515 and on the second side 511 passivation layer 512 is formed. The passivation layer 512 can include regions 512a, 512b, and 512c where none, one or a plurality of regions 512a-512c may overlay a semiconductor device formed in the semiconductor film stack 515. One or more non-metallic vias 529 are formed on one or more regions 512a-512c that may overlay one or more semiconductor devices formed in the semiconductor film stack 515. The non-metallic vias 529 extend through passivation layer 512 and first side 513 and second side 511 of semiconductor wafer 517 to expose a surface of the semiconductor film stack 515. The one or more non-metallic vias 529 may be formed on the semiconductor wafer 517 and on or above each alignment mark 519.

As shown in FIG. 5B, non-metallic vias 529 allow portions underneath semiconductor film stack 515 to be visible using, for example, the naked eye and/or a magnified optical instrument (e.g., a camera). The alignment marks 519 are made visible through the non-metallic vias 529 in, for example, a spectrum of wavelengths in the range of 500-700 nm, a spectrum of wavelengths in the range of 700-2000 nm, or spectrum of wavelengths in the range of 2-50 um. Further, non-metallic vias 529 allow features or marks formed on a second stacking wafer (e.g. semiconductor wafer 507) positioned below the first stacking wafer (e.g. semiconductor wafer 517) to be visible. The non-metallic vias 529 of the first stacking wafer (semiconductor wafer 517) provide visual feedback for in situ alignment of the second stacking wafer (semiconductor wafer 507) throughout the stacking process, allowing an operator to adjust either stacking wafer during a stacking and bonding process based on features or marks visible through the non-metallic vias 529. In this manner, a stacked wafer may include registration marks to allow wafers to be aligned prior to stacking and bonding to allow use of feedback/feedforward wafer processing methodologies.

The second stacking wafer includes semiconductor wafer 507 having an active surface on the first side 503 with semiconductor film stack 505 and on the second side 501 passivation layer 502 is formed. The semiconductor film stack 505 having regions 505a, 505b, and 505c where none, one or a plurality of regions 505a-505c may overlay a semiconductor device formed in the semiconductor film stack 505.

Figure 5C:
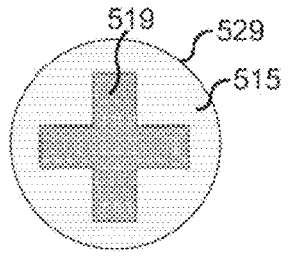
FIG. 5C is a magnified view of a semiconductor device film stack as viewed through the non-metallic via of FIG. 5B.
Figure 5D:
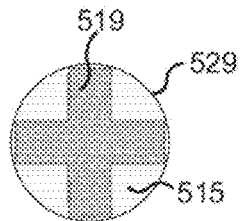
FIG. 5D is a magnified view of another exemplary non-metallic via for viewing semiconductor device film stack of FIG. 5C.
Figure 5E:
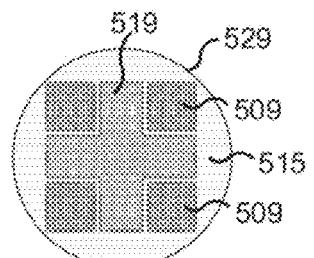
FIG. 5E is a magnified view of the registration mark as viewed through the non-metallic vias of FIG. 5D.

As can be seen with reference to FIGS. 5C-5E, an exemplary alignment mark 519, semiconductor film stack 515, and non-metallic via 529 are shown. The non-metallic via 529 being formed on or above the alignment mark 519. Various other alignment marks may be used including lines, objects, polygons, and other geometric and non-geometric shapes so long as a complementary or corresponding registration marks 509 may be reasonably formed on a second stacking wafer (e.g. on semiconductor wafer 507) and used to align with alignment marks 519 formed on a first stacking wafer (e.g. on semiconductor wafer 517).

As shown in FIG. 5C, non-metallic via 529 allows portions underneath semiconductor film stack 515 to be visible using, for example, the naked eye and/or a magnified optical instrument (e.g., a camera). The alignment mark 519 is made visible through the non-metallic via 529 in, for example, a spectrum of wavelengths in the range of 400-700 nm, a spectrum of wavelengths in the range of 700-2000 nm, or spectrum of wavelengths in the range of 2-50 um. The non-metallic via 529 overlaps the perimeter of alignment mark 519 allowing areas outside of alignment mark 519 to be visible. As shown in FIG. 5D, non-metallic via 529 may be formed to overlap one or more edges of alignment mark 519 still allowing the alignment of registration mark 509 to be visible.

As shown in FIG. 5E, registration mark 509 is visible through non-metallic via 529 and may be used to align first and second stacking wafers (e.g. aligning semiconductor wafer 507 with semiconductor wafer 517). Registration marks 509 may be of a different shape or size such that the area of the registration mark 509 only needs to be inscribed by an area of the non-metallic via 529 for the operator to confirm a first and second stacking wafers are aligned. Registration mark 509 may include an array of visible marks arranged in a predetermined pattern, such as a group of four squares arranged around a common center. Various other registration marks may be used including lines, objects, polygons, and other geometric and non-geometric shapes to obtain registration mark 509 for the first stacking wafer 500A to align with corresponding alignment mark 519 of second stacking wafer 500B.

Figure 6E:
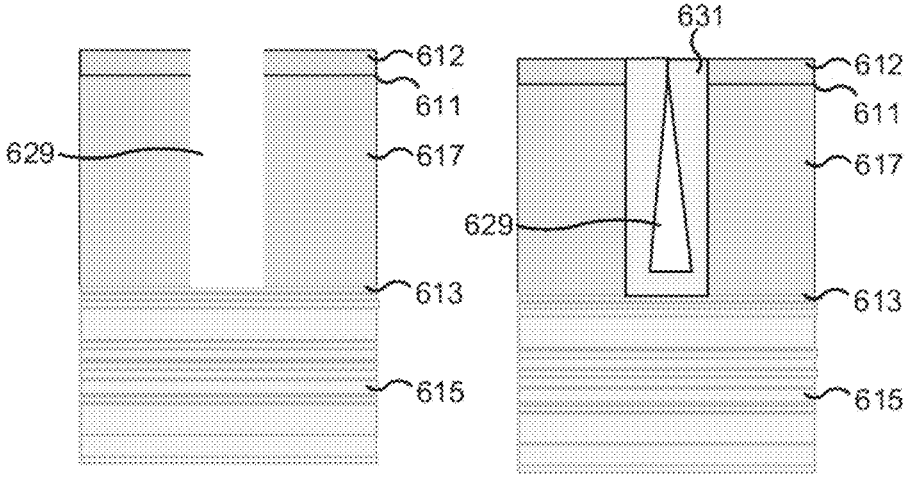
Figure 6E:
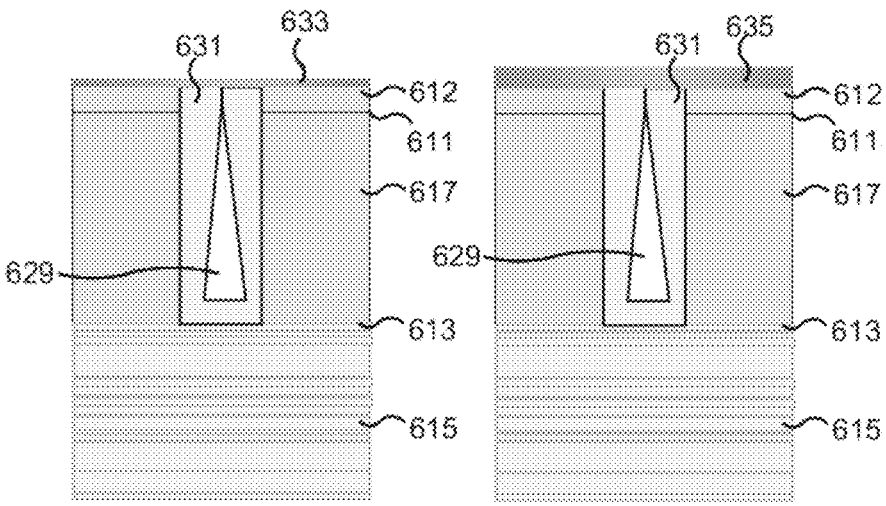
Figure 6E:
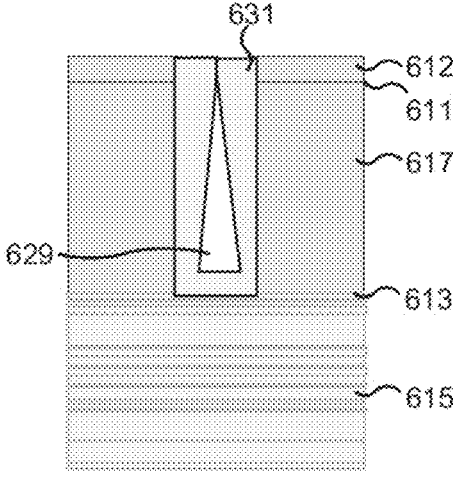

As can be seen with reference to FIGS. 6A-6E, non-photoresist lithography may be performed on the non-metallic via 629 (FIG. 6A), for example, a fill material may be added (FIG. 6B) forming fill layer 631 to fill the non-metallic via 629 and semiconductor wafer 617, and cover the passivation layer 612, semiconductor film stack 615 and first side 613 of the semiconductor wafer 617. As shown in FIGS. 6C-6E, once the non-metallic via 629 is filled, back-end of line processing can be performed without damaging or processing the second side 611 of the semiconductor wafer 617. For example, seed deposition to form seed layer 633 (FIG. 6C), plating to form conductive layer 635 (FIG. 6D), and chemical mechanical polishing (CMP) the carrier to remove seed layer 633 and conductive layer 635 from passivation layer 612 (FIG. 6E).

As can be seen with reference to FIGS. 7A-7E, photoresist lithography may be performed on the non-metallic via 729, for example, plating over fill layer 731 and non-metallic via 729 to form conductive layer 735 to cover the passivation layer 712 and first side 713 of the semiconductor wafer 717. As shown in FIGS. 7B-7E, once the conductive layer 735 is deposited (FIG. 7A), other back-end of line processing can be performed without damaging or processing the second side 711 of the semiconductor wafer 717. For example, adding a photo-resist layer 737 (FIG. 7B), processing/exposure of the photoresist layer to form absorbed/exposed layer 739 (FIG. 7C), removing photoresist (FIG. 7D), and removing conductive layer 735 (FIG. 7E).

The non-metallic vias 329, 429, 529, 629 and 729 of the present disclosure may be filled with a noble or inert gas, air or empty (e.g. a vacuum). The non-metallic via 729 may be filled with, for example, hydrogen (H), nitrogen (N), oxygen (O), fluorine (F), chlorine (Cl), helium (He), neon (Ne), argon (Ar), krypton (Kr), xenon (Xe), radon (Rn) or any combination or mixture of gases thereof. Moreover, the non-metallic vias 729 may be empty or form a vacuum. In some embodiments, the non-metallic vias 729 may further contain other elements or particulates used in the manufacture of the semiconductor device assembly, for example, oxides, nitrides, carbides, copper or aluminum particulates may be suspended in the non-metallic via 729 and/or mixed with fill layer 631 or 731. Moreover, each of the one or more non-metallic vias 329, 429, 529, 629 and 729 of the present disclosure may be filled with different gases, materials (e.g. elements or particulates), or any combination or mixture of gases or materials presented above. For example, referring to FIG. 5B, a left non-metallic via 529 may include oxygen gas, whereas an adjacent non-metallic vias 529 may include air.

Examples of material which could be used in the formation of the fill layer 631 and fill layer 731 may include, for example, passivation layer(s), oxides, nitrides and carbides, e.g. silicon nitride, silicon carbide, silicon carbon nitride, silicide, and silicon dioxide, epoxy, silicon oxide, or a combination thereof may be used to form a protective layer, encapsulant, or passivation as desired. Any convenient deposition method may be used, including spin coating, chemical vapor deposition (CVD), atomic layer deposition (ALD), vapor deposition polymerization (VDP), or physical vapor deposition (PVD).

Examples of metals which could be used in the formation of conductive layer 635 and conductive layer 735 may include copper, aluminum, tungsten, tin, silver, gold or any of the six platinum metals (i.e., Ru, Rh, Pd, Os, Ir, or Pt). Any convenient deposition method may be used, including chemical vapor deposition (CVD), physical vapor deposition (PVD), e.g., sputtering, or electroplating.

Figure 8:
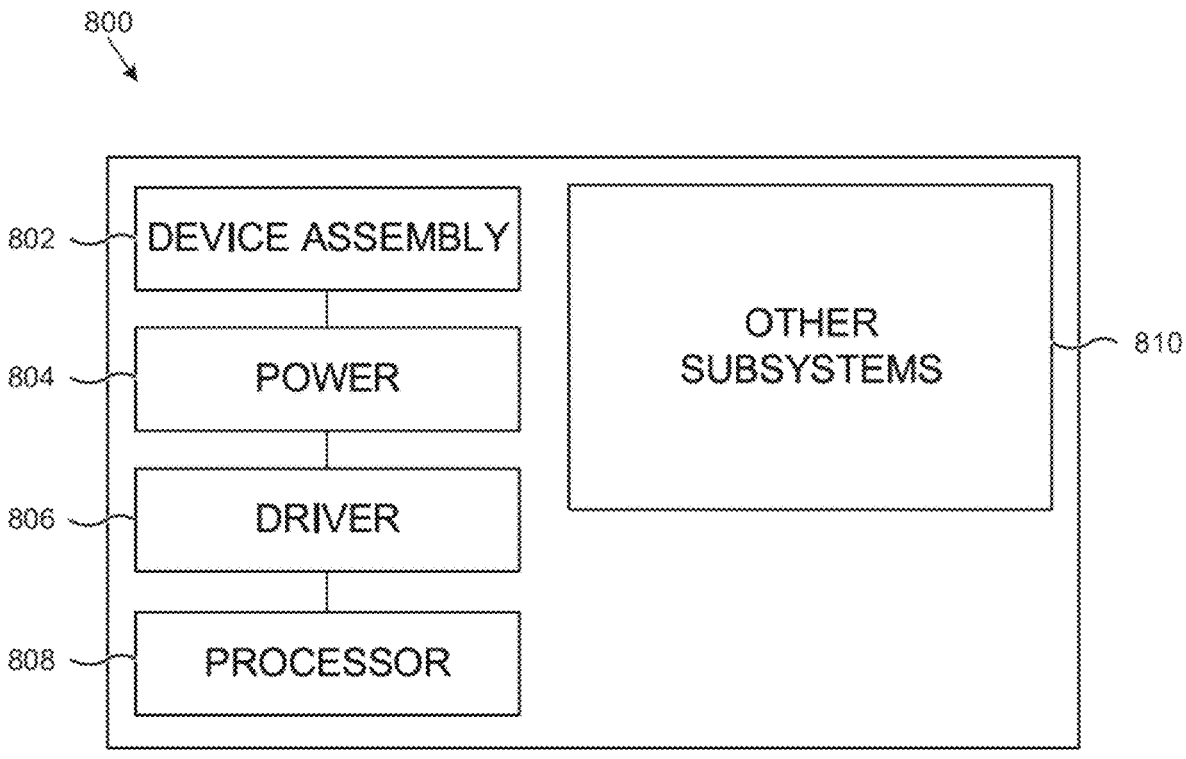
FIG. 8 is a schematic view showing an exemplary system that includes a semiconductor device assembly configured in accordance with an exemplary embodiment of the present disclosure.

Any one of the exemplary semiconductor devices and semiconductor device assemblies described above with reference to FIGS. 1A-7E can be incorporated into any of a myriad of larger and/or more complex systems, a representative example of which is system 800 shown schematically in FIG. 8. The system 800 can include semiconductor device assembly (e.g., or a discrete semiconductor device) 802, power source 804, driver 806, processor 808, and/or other subsystems or components 810. The semiconductor device assembly 802 can include features generally similar to those of the semiconductor devices described above with reference to FIGS. 1A-7E. The resulting system 800 can perform any of a wide variety of functions, such as memory storage, data processing, and/or other suitable functions. Accordingly, representative systems 800 can include, without limitation, hand-held devices (e.g., mobile phones, tablets, digital readers, and digital audio players), computers, vehicles, appliances and other products. Components of the system 800 may be housed in a single unit or distributed over multiple, interconnected units (e.g., through a communications network). The components of the system 800 can also include remote devices and any of a wide variety of computer readable media.

Figure 9:
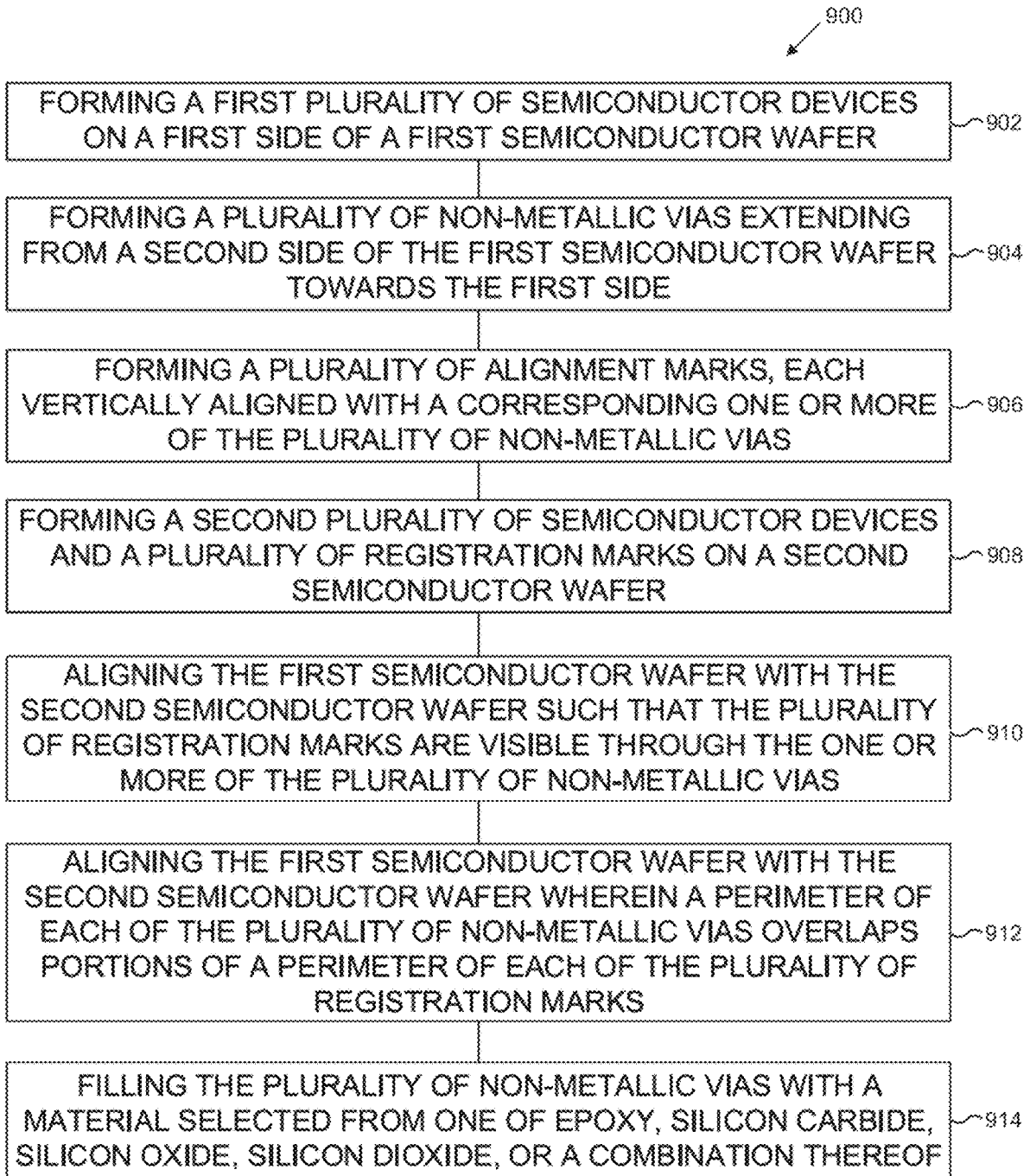
FIG. 9 is a flow chart illustrating an exemplary method of making a semiconductor device assembly in accordance with an exemplary embodiment of the present disclosure.

FIG. 9 is a flow chart illustrating an exemplary method of making a semiconductor device assembly. The exemplary method is provided by way of example, as there are a variety of ways to carry out the method. Each box shown in FIG. 9 represents one or more processes, methods or subroutines, carried out in the exemplary method. FIGS. 1A-7E show exemplary embodiments of carrying out the method of FIG. 9. The exemplary method may begin at box 902. Further for explanatory purposes, the boxes of the example process 900 are described herein as occurring in serial, or linearly. However, multiple boxes of the example process 900 may occur in parallel. In addition, the boxes of the example process 900 may be performed a different order than the order shown and/or one or more of the boxes of the example process 900 may not be performed.

The exemplary method of FIG. 9 includes forming a first plurality of semiconductor devices on first side of first semiconductor wafer (box 902). The method further includes forming a plurality of non-metallic vias extending from second side of the first semiconductor wafer towards the first side, the second side being opposite to the first side (box 904). The method further includes forming a plurality of alignment marks, each vertically aligned with a corresponding one or more of the plurality of non-metallic vias (box 906).

In some exemplary embodiments, one or more of the plurality of non-metallic vias may be formed along the perimeter of each of the plurality of alignment marks to vertically align with and correspond to each of the plurality of registrations marks. In some exemplary embodiments, the one or more of the plurality of non-metallic vias may be formed along the perimeter of each of the plurality of alignment marks to vertically align with and encapsulate an area of each of the plurality of registrations marks corresponding to the alignment mark. The method may further include forming at least one of the plurality of non-metallic vias within a footprint of one of the first plurality of semiconductor devices, forming at least one of the plurality of non-metallic vias between footprints of two adjacent first plurality of semiconductor devices, or a combination thereof. The plurality of non-metallic vias may be formed along scribe/cutting lines to facilitate ease in singulating the semiconductor devices, or the plurality of non-metallic vias may be formed on a footprint of the semiconductor device and remain on the singulated semiconductor device or semiconductor die.

In some exemplary embodiments, the plurality of alignment marks may be formed on the second side of the first semiconductor wafer. In some exemplary embodiments, and not being limited to, the plurality of alignment marks may be formed on a surface of the first plurality of semiconductor devices opposite to the first side of the first semiconductor wafer.

The method further includes forming a second plurality of semiconductor devices and a plurality of registration marks on second semiconductor wafer, where each of the plurality of registration marks vertically align with a corresponding one or more of the plurality of alignment marks (box 908). The method further includes aligning the first semiconductor wafer over the second semiconductor wafer such that the plurality of registration marks is visible through the one or more of the plurality of non-metallic vias (box 910).

In some exemplary embodiments, the plurality of registration marks may be visible or seen through the plurality of non-metallic vias in, for example, a spectrum of wavelengths in the range of 400-700 nm, a spectrum of wavelengths in the range of 700-2000 nm, or spectrum of wavelengths in the range of 2-50 um.

The method further includes aligning the first semiconductor wafer with the second semiconductor wafer wherein a perimeter of each of the plurality of non-metallic vias overlaps portions of a perimeter of each of the plurality of registration marks (box 912). Thus, aligning the plurality of non-metallic vias with the plurality of registration marks allows the first and second semiconductor wafers to be aligned in a stacking process thereby facilitating alignment accuracy for optically aligning the first plurality of semiconductor devices formed on the first semiconductor wafer to be stacked on the second plurality of semiconductor devices formed on the second semiconductor wafer.

In some exemplary embodiments, the method may further include aligning the first semiconductor wafer with the second semiconductor wafer wherein such that a perimeter of each of the plurality of non-metallic vias overlaps a perimeter of each of the plurality of registration marks. The method may further include aligning the first semiconductor wafer with the second semiconductor such that the perimeter of each of the plurality of non-metallic vias to overlap a perimeter of each of the plurality of alignment marks.

The method further includes filling the plurality of non-metallic vias with a material selected from one of epoxy, silicon carbide, silicon oxide, silicon dioxide, or a combination thereof (box 914). In some exemplary embodiments, a width of each of the plurality of non-metallic vias may be between 1-15 um and a height of each of the plurality of non-metallic vias may be between 10-20 um.

As illustrated in FIGS. 6A-6E, further processing may be done on the filled plurality of non-metallic vias, for example, seed deposition, plating, chemical mechanical polishing (CMP), stacking, bonding and singulating the semiconductor devices. Alternatively, as illustrated in FIGS. 7A-7E, the plurality of non-metallic vias may not be filled and instead processed through other lithographic process as the case or design needs in forming the semiconductor devices, for example, plating, seed deposition, adding/removing photoresist, and removing seed deposition thereby allowing the plurality of non-metallic vias to be used as, for example, scribe/cutting lines to facilitate ease in singulating the stacked semiconductor devices.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the present disclosure have been described herein for purposes of illustration, but that various modifications may be made without deviating from the scope of the present disclosure. Rather, in the foregoing description, numerous specific details are discussed to provide a thorough and enabling description for embodiments of the present disclosure. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the present disclosure. In general, it should be understood that various other devices, systems, and methods in addition to those specific embodiments disclosed herein may be within the scope of the present disclosure.

What is claimed:

1. A semiconductor device assembly, comprising:
   a first semiconductor wafer having a first side and a second side opposite the first side, the first semiconductor wafer including:

a first layer comprising a first plurality of semiconductor devices at the first side, wherein an outer surface of the first layer is continuous across the first semiconductor wafer, a plurality of non-metallic vias extending from the second side towards the first side to an inner surface of the first layer, and a plurality of alignment marks, each vertically aligned with a corresponding one or more of the plurality of non-metallic vias; and a second semiconductor wafer including:

a second layer comprising a second plurality of semiconductor devices, wherein an outer surface of the second later is continuous across the second semiconductor wafer, and a plurality of registration marks on the outer surface of the second layer, each of the plurality of registration marks vertically aligned with a corresponding one or more plurality of alignment marks.

2. The semiconductor device assembly of claim 1, wherein the plurality of registration marks is visible through the plurality of non-metallic vias and the first layer in a spectrum of wavelengths in a range of 400-700 mm.

3. The semiconductor device assembly of claim 2, wherein a perimeter of each of the plurality of non-metallic vias overlaps at least a portion of the corresponding one or more of the plurality of registration marks.

4. The semiconductor device assembly of claim 2, wherein a perimeter of each of the plurality of non-metallic vias overlaps a perimeter of each of the corresponding one or more of the plurality of registration marks.

5. The semiconductor device assembly of claim 1, wherein a perimeter of each of the plurality of non-metallic vias overlaps a perimeter of the corresponding one of the plurality of alignment marks.

6. The semiconductor device assembly of claim 1, wherein at least one of the plurality of alignment marks is formed at a surface of the first plurality of semiconductor devices opposite to the first side of the first semiconductor wafer and within a footprint of one of the first plurality of semiconductor devices.

7. The semiconductor device assembly of claim 1, wherein the plurality of alignment marks is formed on the second side of the first semiconductor wafer.

8. The semiconductor device assembly of claim 1, wherein at least one of the plurality of non-metallic vias is formed within a footprint of one of the first plurality of semiconductor devices.

9. The semiconductor device assembly of claim 1, wherein one or more of the plurality of non-metallic vias is formed along a perimeter of each of the plurality of alignment marks.

10. The semiconductor device assembly of claim 1, wherein the plurality of non-metallic vias is filled with a material selected from one of epoxy, silicon carbide, silicon oxide, silicon dioxide, or a combination thereof.

11. A method of making a semiconductor device assembly, comprising:

forming a first plurality of semiconductor devices in a first layer of a first semiconductor wafer at a first side of the first semiconductor wafer, wherein an outer surface of the first layer is continuous across the first semiconductor wafer;

forming a plurality of non-metallic vias extending from a second side of the first semiconductor wafer towards the first side to an inner surface of the first layer, wherein the second side is opposite to the first side;

forming a plurality of alignment marks, each vertically aligned with a corresponding one or more of the plurality of non-metallic vias;

forming a second plurality of semiconductor devices in a second layer of a second semiconductor wafer, wherein an outer surface of the second layer is continuous across the second semiconductor wafer;

forming a plurality of registration marks on the outer surface of the second layer; and aligning the first semiconductor wafer with the second semiconductor wafer such that each of the plurality of registration marks is vertically aligned with a corresponding one or more of the plurality of alignment marks.

12. The method of claim 11, wherein aligning the first semiconductor wafer with the second semiconductor wafer comprises viewing the one or more of the plurality of registration marks through one or more of the plurality of non-metallic vias and the first layer in a spectrum of wavelengths in a range of 400-700 nm.

13. The method of claim 11, wherein aligning the first semiconductor wafer with the second semiconductor wafer comprises aligning a perimeter of each of the plurality of non-metallic vias to overlap portions of a perimeter of each of the plurality of registration marks.

14. The method of claim 11, wherein aligning the first semiconductor wafer with the second semiconductor wafer comprises aligning a perimeter of each of the plurality of non-metallic vias to overlap a perimeter of each of the plurality of registration marks.

15. The method of claim 11, wherein aligning the first semiconductor wafer with the second semiconductor wafer further comprises aligning a perimeter of each of the plurality of non-metallic vias to overlap a perimeter of each of the plurality of alignment marks.

16. The method of claim 11, wherein forming the plurality of alignment marks comprises forming the plurality of alignment marks at a surface of the first plurality of semiconductor devices opposite to the first side of the first semiconductor wafer and within a footprint of one of the first plurality of semiconductor devices.

17. The method of claim 11, wherein forming the plurality of alignment marks further comprises forming the plurality of alignment marks on the second side of the first semiconductor wafer.

18. The method of claim 16, wherein forming the plurality of non-metallic vias further comprises forming at least one of the plurality of non-metallic vias within the footprint of one of the first plurality of semiconductor devices.

19. The method of claim 18, wherein forming the plurality of non-metallic vias further comprises forming one or more of the plurality of non-metallic vias along a perimeter of each of the plurality of alignment marks to vertically align with and correspond to each of the plurality of registration marks.

20. The method of claim 19, further comprising filling the plurality of non-metallic vias with a material selected from one of epoxy, silicon carbide, silicon oxide, silicon dioxide, or a combination thereof.

21. A semiconductor device assembly, comprising:

a first semiconductor wafer having a first side and a second side opposite the first side, the first semiconductor wafer including:

a first plurality of semiconductor devices at the first side, a plurality of non-metallic vias extending from the second side towards the first side, wherein a width of each of the plurality of non-metallic vias is between 1-15 um, and a plurality of alignment marks, each vertically aligned with a corresponding one or more of the plurality of non-metallic vias; and a second semiconductor wafer including a second plurality of semiconductor devices and a plurality of registration marks, each of the plurality of registration marks vertically aligned with a corresponding one or more of the plurality of alignment marks;

wherein a perimeter of each of the plurality of non-metallic vias overlaps a perimeter of each of the corresponding one or more of the plurality of registration marks, and wherein at least one of the plurality of non-metallic vias is formed between footprints of two adjacent first plurality of semiconductor devices, wherein the plurality of registration marks is visible through the plurality of non-metallic vias in a spectrum of wavelengths in a range of 400-700 nm, and wherein the plurality of non-metallic vias is filled with a material selected from one of epoxy, silicon carbide, silicon oxide, silicon dioxide, or a combination thereof.

22. The semiconductor device assembly of claim 21, wherein the perimeter of each of the plurality of non-metallic vias overlaps at least a portion of the corresponding one or more of the plurality of registration marks.

23. The semiconductor device assembly of claim 22, wherein the perimeter of each of the plurality of non-metallic vias further overlaps a perimeter of the corresponding one of the plurality of alignment marks.

\* \* \* \* \*